United States Patent
Okumura et al.

(10) Patent No.: US 10,340,399 B2
(45) Date of Patent: Jul. 2, 2019

(54) OPTICAL DEVICE

(71) Applicant: PHOTONICS ELECTRONICS TECHNOLOGY RESEARCH ASSOCIATION, Tokyo (JP)

(72) Inventors: Shigekazu Okumura, Tokyo (JP); Tohru Mogami, Tokyo (JP); Keizo Kinoshita, Tokyo (JP); Tsuyoshi Horikawa, Tokyo (JP); Junichi Fujikata, Tokyo (JP)

(73) Assignee: PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 15/748,994

(22) PCT Filed: Jul. 28, 2016

(86) PCT No.: PCT/JP2016/072132
§ 371 (c)(1),
(2) Date: Jan. 30, 2018

(87) PCT Pub. No.: WO2017/018477
PCT Pub. Date: Feb. 2, 2017

(65) Prior Publication Data
US 2019/0006532 A1 Jan. 3, 2019

(30) Foreign Application Priority Data
Jul. 30, 2015 (JP) ................. 2015-150525

(51) Int. Cl.
H01L 31/028 (2006.01)
H01L 31/036 (2006.01)
H01L 31/102 (2006.01)
H01L 31/105 (2006.01)
H01L 31/109 (2006.01)
H01L 31/0232 (2014.01)

(52) U.S. Cl.
CPC ...... *H01L 31/028* (2013.01); *H01L 31/02327* (2013.01); *H01L 31/036* (2013.01); *H01L 31/102* (2013.01); *H01L 31/105* (2013.01); *H01L 31/109* (2013.01)

(58) Field of Classification Search
None
See application file for complete search history.

(56) References Cited

U.S. PATENT DOCUMENTS

| 2014/0355636 A1 | 12/2014 | Okumura et al. |
| 2015/0097256 A1 | 4/2015 | Ang et al. |
| 2017/0025562 A1* | 1/2017 | Knoll ............. G02B 6/42 |

FOREIGN PATENT DOCUMENTS

| JP | 2013-207231 A1 | 10/2013 |
| WO | WO-2007/055740 A1 | 5/2007 |
| WO | WO-2013/088490 A1 | 6/2013 |

OTHER PUBLICATIONS

Fujikata, Junichi, et al. "Si Waveguide-Integrated Metal-Semiconductor-Metal and p-i-n-Type Ge Photodiodes Using Si-Capping Layer." Japanese Journal Of Applied Physics, vol. 52, No. 4S, 2013, doi:10.7567/jjap.52.04cg10.*

(Continued)

Primary Examiner — J. E. Schoenholtz
(74) Attorney, Agent, or Firm — Michael Best & Friedrich LLP

(57) ABSTRACT

Provided is an optical device in which an Si cap layer is provided on a Ge layer, and which is capable of effectively reducing dark current, while having a good effect on prevention of production line contamination by Ge. One embodiment of the optical device according to the present invention is provided with: a semiconductor layer which contains Ge and has a (001) surface and a facet surface between the (001) surface and a (110) surface; and a cap layer which is formed from Si, and which is formed on the (001) surface and the facet surface of the semiconductor (Continued)

layer. The ratio of the film thickness of the cap layer on the facet surface to the film thickness of the cap layer on the (001) surface is 0.4 or more; and the film thickness of the cap layer on the (001) surface is from 9 nm to 30 nm (inclusive).

4 Claims, 7 Drawing Sheets

(56) References Cited

OTHER PUBLICATIONS

Okumura, Shigekazu, et al. "Study on the Effects of the Si Capping Layer Growth Conditions on the Leakage Current of Ge Photodetector." Japanese Journal of Applied Physics, vol. 56, No. 10, 2017, p. 102201., doi:10.7567/jjap.56.102201.*
Makoto Miura et al., "Differential receivers with highly-uniform MSM Germanium photodetectors capped by SiGe layer," Optics Express, vol. 21, No. 20, Sep. 2013, pp. 23295-23306 (12 pages), the Optical Society, USA.
Junichi Fujikata et al., "Si Waveguide-Integrated Metal-Semiconductor-Metal and p-i-n Type Ge Photodiodes Using Si-Capping Layer", Japanese Journal of Applied Physics vol. 52. No. 45 (2013), 04CG10, pp. 04CG10-1-04CG10-5 (5 pages), The Japan Society of Applied Physics, Japan.
International Search Report issued in Application No. PCT/JP2016/072132, dated Oct. 11, 2016.
Office Action issued in Japanese Application No. 2015-150525, dated Feb. 8, 2019.

* cited by examiner

OPTICAL DEVICE

TECHNICAL FIELD

The present invention relates to an optical device, more specifically, an optical device in which a cap layer is formed on a Ge layer.

BACKGROUND ART

In a Ge optical receiver which uses Ge in a light absorbing layer, a structure wherein a cap layer comprising SiGe or Si is formed on a Ge layer for covering the Ge layer has been known. In the structure, it is possible to reduce dark current of the Ge optical receiver by forming a Schottky barrier between the SiGe or Si cap layer and a metal electrode. An SiGe cap layer can be deposited in a satisfactory manner on a Ge layer, which is formed by selective epitaxial growth and comprises facet surfaces, by optimizing conditions of deposition; thus, it provides stable effect for reducing dark current. On the other hand, since a difference between a lattice constant of an Si cap layer and that of Ge is large, it is difficult to deposit the layer in a satisfactory manner on a facet surface of a Ge layer, especially. Thus, in a Ge optical receiver in which an Si cap layer is used, although it is possible to reduce dark current when a low bias voltage is applied, it is reported that there is a problem that dark current increases when a high bias voltage is applied.

CITATION LIST

Non Patent Literature

NPL 1: M. Miura et al., "Differential receivers with highly-uniform MSM Germanium photodetectors capped by SiGe layer," Optics Express, Vol. 21, No. 20, 2013, pp. 23295-23306

SUMMARY OF INVENTION

Technical Problem

However, since a Schottky barrier formed by joining Si and metal with each other is usually larger than a Schottky barrier formed by joining SiGe and metal with each other, it is expected that dark current reducing effect, that is provided by an Si cap layer, is potentially higher than that provided by an SiGe cap layer. Further, in view of prevention of contamination due to Ge in a production line, it is preferable to use an Si cap layer. Accordingly, there is need to realize a structure in which an Si cap layer is formed on a Ge layer, and by which dark current can be effectively reduced and effect for preventing contamination due to Ge in a production line is provided.

The present invention has been made in view of the above matters; and an object of the invention is to provide an optical device in which an Si cap layer is formed on a Ge layer, and by which dark current can be effectively reduced and effect for preventing contamination due to Ge in a production line is provided.

Solution to Problem

For solving the problems described above, an embodiment of the present invention is an optical device which comprises: a semiconductor layer which comprises Ge and has a (001) plane and a facet surface between the (001) plane and a (110) plane; and a cap layer which comprises Si and is formed on the (001) plane and the facet surface of the semiconductor layer; wherein a ratio of a film thickness of the cap layer at the facet surface to a film thickness of the cap layer at the (001) plane is equal to or greater than 0.4, and the film thickness of the cap layer at the (001) plane is equal to or greater than 9 nm and equal to or less than 30 nm.

Another embodiment of the present invention comprises the above embodiment, wherein the optical device is constructed as a light receiving element, a light emitting element, or an optical modulator.

Further, a different embodiment of the present invention comprises the above embodiment, wherein the light receiving element is an MSM-type photodiode or a pin-type photodiode.

Advantageous Effects of Invention

According to the present invention, an optical device, in which an Si cap layer is formed on a Ge layer and by which dark current can be effectively reduced and effect for preventing contamination due to Ge in a production line is provided, can be obtained.

DESCRIPTION OF EMBODIMENTS

In the following, embodiments of the present invention will be explained with reference to the figures.

First Embodiment

Figure 1:
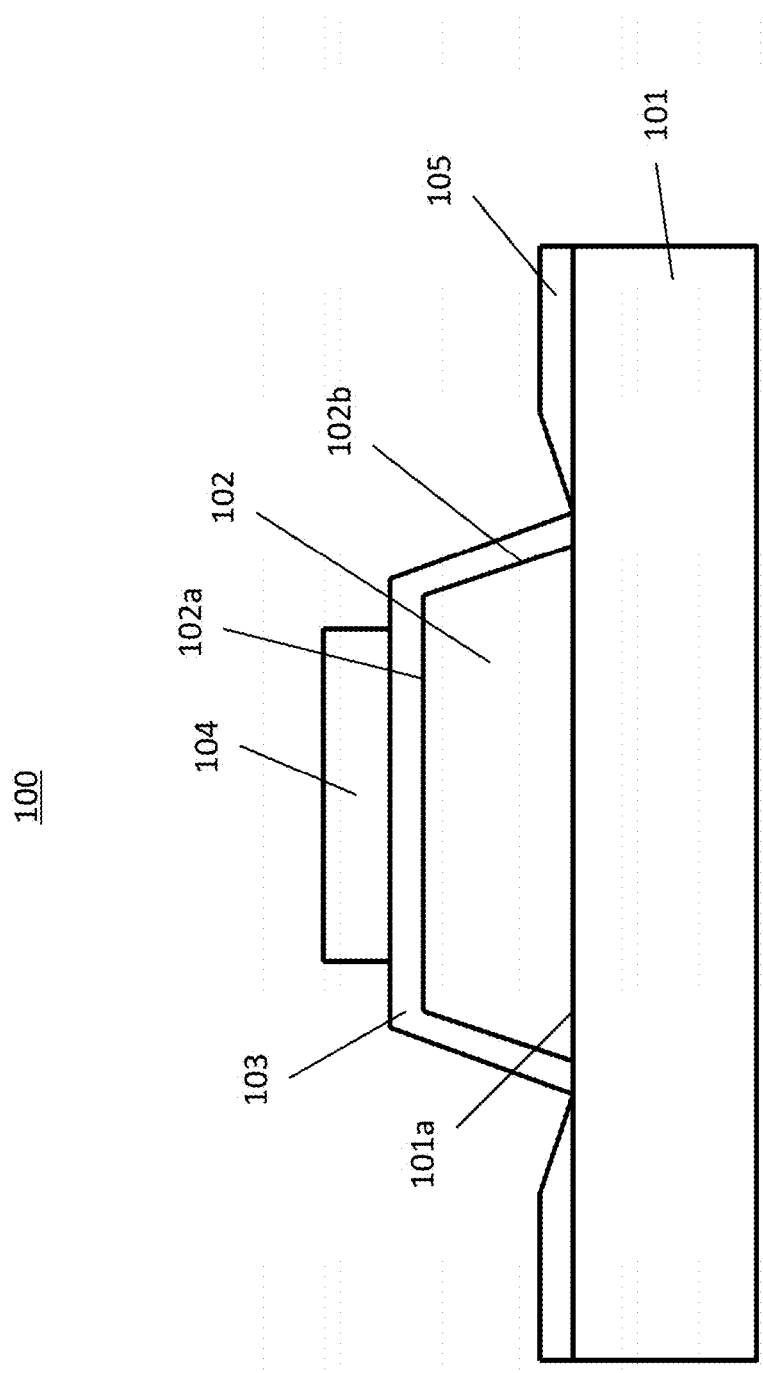
FIG. 1 is a drawing showing a schematic cross-sectional construction of an optical device 100 according to a first embodiment.

FIG. 1 is a drawing which shows a schematic cross-sectional construction of an optical device 100 according to a first embodiment of the present invention. The optical device 100 in FIG. 1 is a representative of a basic structure which can be applied to a light receiving element, a light emitting element, an optical modulator, and so on. The optical device 100 comprises a Ge (germanium) layer 102 formed on a substrate 101, and an Si (silicon) layer 103 formed on the Ge layer 102 for covering surfaces of the Ge layer 102. The optical device 100 may further comprises a metal electrode 104 and an insulating film. The substrate 101 is a substrate comprising, for example, Si or SOI (Silicon On Insulator) or the like. A top surface 101a of the substrate 101 comprises a (001) plane of a crystal lattice. The Ge layer 102 is formed by epitaxially growing a Ge crystalline layer on the (001) plane 101a of the substrate 101. Thus, a top surface 102a of the Ge layer 102 is a (001) plane which is the same as the top surface 101a of the substrate 101. Surfaces other than the (001) plane 102a of the Ge layer 102 are constructed as facet surfaces 102b. The facet surface 102b of the Ge layer 102 is a crystalline plane having an angle between a (110) plane and the (001) plane of the Ge crystal lattice. For example, the facet surface 102b of the Ge layer 102 is a (311) plane, and an angle between the facet surface 102b and the top surface 102a of the Ge layer 102 is, for example, between 20° and 40°. The Ge layer 102 may be a layer which partially includes Ge. For example, the Ge layer 102 may be an SiGe layer which is a mixed crystal comprising Si and Ge.

The Si layer 103 is formed in such a manner that it covers a whole surface of the Ge layer 102, that is, the (001) plane 201a and the facet surface 102b of the Ge layer 102. The Si layer 103 can be formed, for example, by epitaxially growing an Si crystalline layer; wherein, regarding the growth rate of the Si crystalline layer during the epitaxial growth, the growth rate at the (001) plane 102a of the Ge layer 102 is generally larger than the growth rate at the facet surface 102b of the Ge layer 102. Thus, the film thickness $t_{facet}$ of the Si layer 103 on the facet surface 102b of the Ge layer 101 (hereinafter, this is simply referred to as "the facet-part film thickness") is made to be thinner than the film thickness $t_{top}$ of the Si layer 103 on the (001) plane 102a of the Ge layer 102 (hereinafter, this is simply referred to as "the (001)-plane film thickness"). As explained previously, in the case that the film thickness of the Si layer at the facet part is thin, there may be a risk that dark current increases when a high bias voltage is applied. In the optical device 100 according to the present embodiment, the film thickness of the Si layer 103 is controlled in such a manner that a ratio of the facet-part film thickness to the (001)-plane film thickness, i.e., $t_{facet}/t_{top}$, is set to 0.4 or greater, and the (001)-plane film thickness $t_{top}$ of the Si layer 103 is set to a value equal to or greater than 9 nm and equal to or less than 30 nm.

The reason to set the (001)-plane film thickness $t_{top}$ of the Si layer 103 to a value equal to or less than 30 nm is to prevent the electric resistance between the Ge layer 102 and the metal electrode 104 from becoming excessively large. The basis to set the film thickness ratio of the Si layer 103 $t_{facet}/t_{top}$ to 0.4 or greater and the (001)-plane film thickness $t_{top}$ of the Si layer 103 to 9 nm or greater will be explained later with reference to FIGS. 6 and 7. Note that the facet surface 102b of the Ge layer 102 may be a non-planar surface which has large roughness; and, due to such large roughness, the facet-part film thickness of the Si layer 103 may vary locally. In such a case, the film thickness at a region, where the film thickness is thinnest, in the facet part is defined to be the facet-part film thickness $t_{facet}$ of the Si layer 103.

The optical device 100 according to the present embodiment adopts, as a cap layer for covering the Ge layer 102, the Si layer 103 which has thickness ($t_{top}$ and $t_{facet}$) such as those described above, so that a high Schottky barrier can be formed at the Si layer 103 by joining the Si layer 103 and the metal electrode 104 with each other; and, as a result, dark current that appears when a high bias voltage is applied can be effectively reduced. Further, since the Ge layer 102 is covered by the Si layer 103 which does not include Ge, contamination due to Ge in a production line can be prevented.

Second Embodiment

Figure 2:
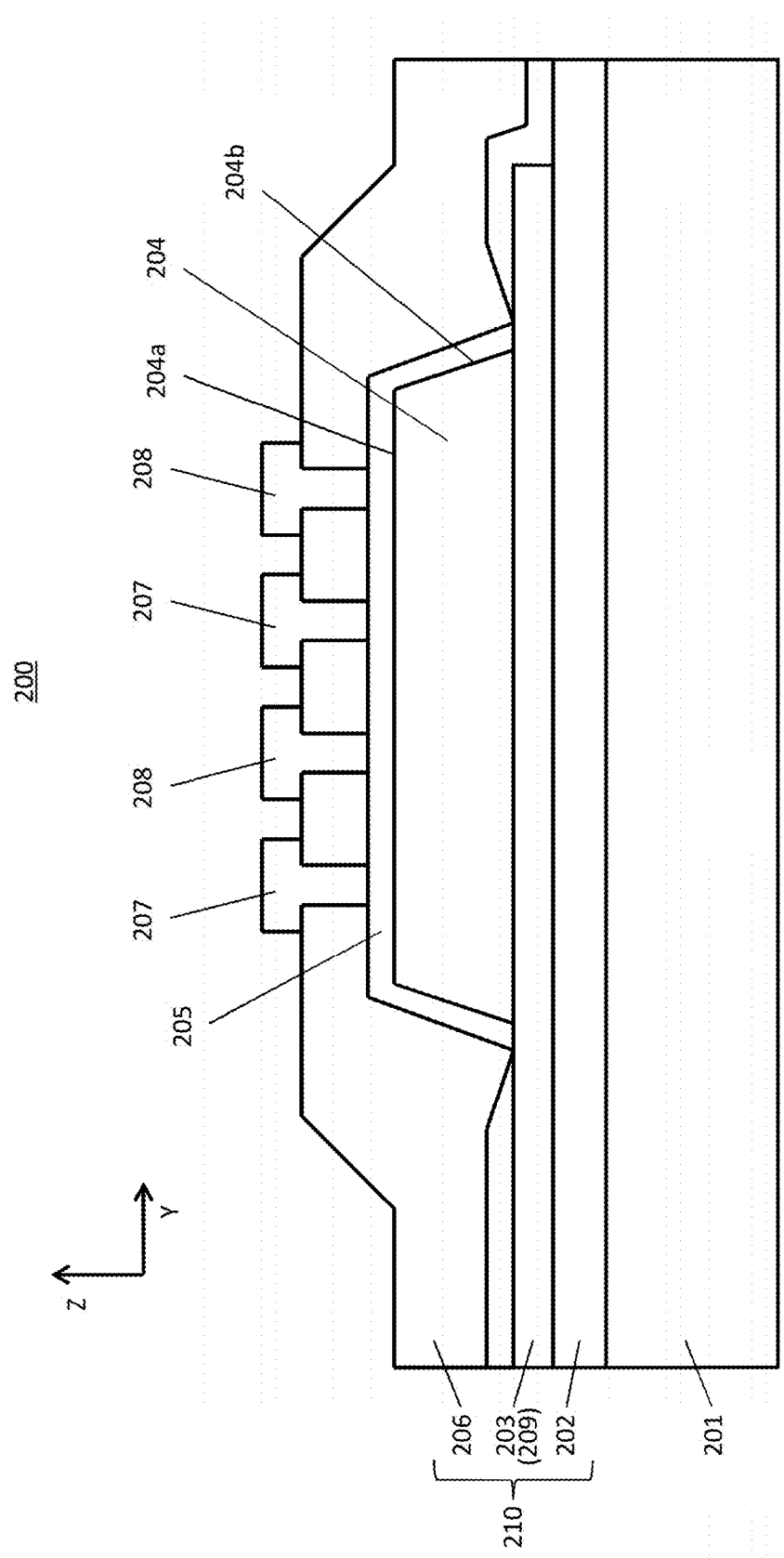
FIG. 2 is a drawing showing a schematic cross-sectional construction of a light receiving element (an MSM-type photodiode) 200 according to a second embodiment.
Figure 3:
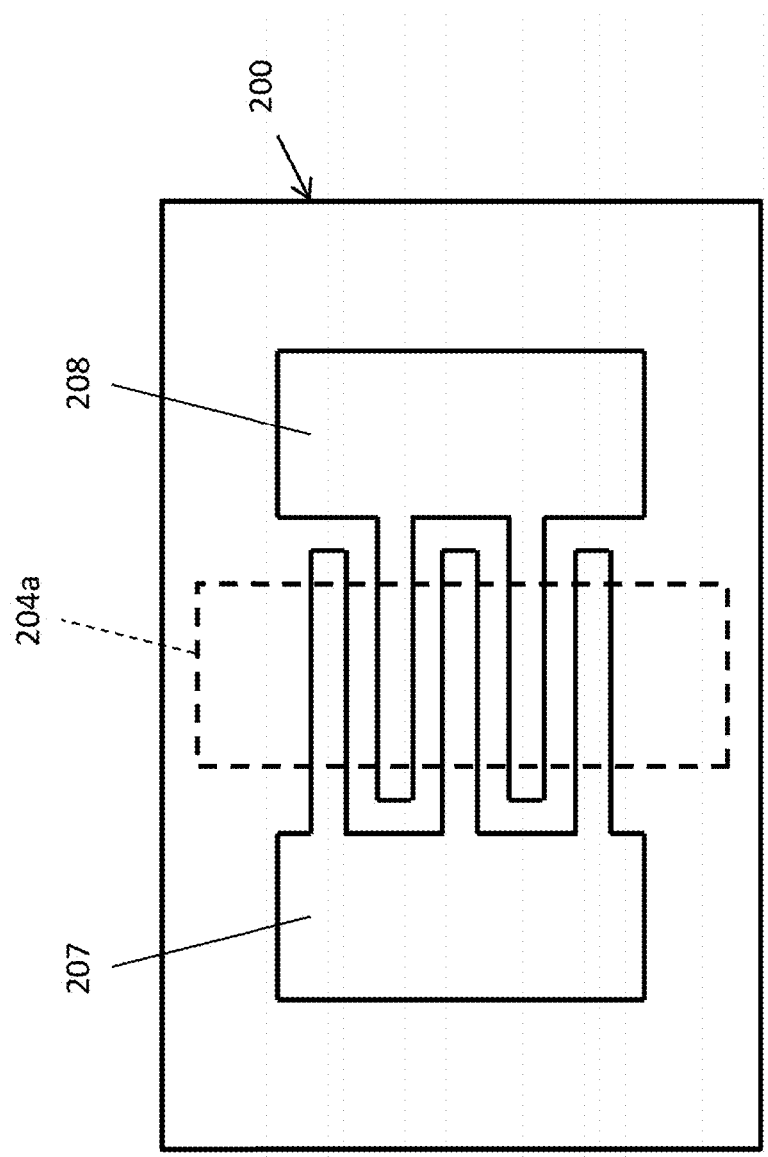
FIG. 3 is a top view of the light receiving element 200 according to the second embodiment.

FIG. 2 is a drawing which shows a schematic cross-sectional construction of a light receiving element (an MSM (Metal/Semiconductor/Metal)-type photodiode) 200 according to a second embodiment of the present invention. FIG. 3 is a top view of the light receiving element 200, and shows shapes and arrangements of metal electrodes. The light receiving element 200 is a specific example of the optical device 100 according to the first embodiment. The light receiving element 200 comprises a light absorbing layer 204 formed on a SOI (Silicon On Insulator) layer 203, and an upper semiconductor layer 205 formed on the light absorbing layer 204. The light absorbing layer 204 and the upper semiconductor layer 205 correspond to the Ge layer 102 and the Si layer 103 of the optical device 100 shown in FIG. 1, respectively. The light receiving element 200 is made by using an SOI substrate which comprises an Si substrate 201, a buried oxide film layer (BOX layer) 202, and an SOI layer 203 on the BOX layer 202.

The light absorbing layer 204 is a layer comprising Ge. The light absorbing layer 204 is formed by epitaxially growing a Ge crystalline layer on the SOI layer 203. A top surface 204a of the light absorbing layer 204 is a (001) plane of the Ge crystal lattice. Surfaces other than the (001) plane 204a of the light absorbing layer 204 are constructed as facet surfaces 204b. The facet surface 204b of the light absorbing layer 204 is a crystalline plane having an angle between a (110) plane and the (001) plane of the Ge crystal lattice. For example, the facet surface 204b of the light absorbing layer 204 is a (311) plane, and an angle between the facet surface 204b and the top surface 204a of the light absorbing layer 204 is, for example, between 20° and 40°. Note that the light absorbing layer 204 may be an SiGe layer which is a mixed crystal comprising Si and Ge.

The upper semiconductor layer 205 is a layer comprising Si. The upper semiconductor layer 205 is formed by epitaxially growing an Si crystalline layer in such a manner that it covers the (001) plane 204a and the facet surfaces 204b of the light absorbing layer 204. The film thickness of the upper semiconductor layer 205 is to be made in such a manner that the film thickness $t_{facet}$ of a part above the facet surface 204b of the light absorbing layer 204 (hereinafter, this is simply referred to as "the facet-part film thickness") is made to be thinner than the film thickness $t_{top}$ of a part above the (001) plane 204a of the light absorbing layer 204 (hereinafter, this is simply referred to as "the (001)-plane film thickness"). As explained previously, in the case that the film thickness of the Si layer (the upper semiconductor layer 205) at the facet part is thin, there may be a risk that dark current increases when a high bias voltage is applied. In the light receiving element 200 according to the present embodiment, the film thickness of the upper semiconductor layer 205 is controlled in such a manner that a ratio of the facet-part film thickness to the (001)-plane film thickness, i.e., $t_{facet}/t_{top}$, is set to 0.4 or greater, and the (001)-plane film thickness $t_{top}$ of the upper semiconductor layer 205 is set to a value equal to or greater than 9 nm and equal to or less than 30 nm.

The reason to set the (001)-plane film thickness $t_{top}$ of the upper semiconductor layer 205 to a value equal to or less than 30 nm is to prevent the electric resistance between the light absorbing layer 204 and the first and second metal electrodes 207 and 208 from becoming excessively large. The basis to set the film thickness ratio of the upper semiconductor layer 205 to 0.4 or greater and the (001)-plane film thickness $t_{top}$ of the upper semiconductor layer 205 to 9 nm or greater will be explained later with reference to FIGS. 6 and 7. Note that the facet surface 204b of the light absorbing layer 204 may be a non-planar surface which has large roughness; and, due to such large roughness, the facet-part film thickness of the upper semiconductor layer 205 may vary locally. In such a case, the film thickness at a region, where the film thickness is thinnest, in the facet part is defined to be the facet-part film thickness $t_{facet}$ of the upper semiconductor layer 205.

The surface of the light receiving element 200 is covered by an insulating film 206. The insulating film 206 is an $SiO_2$ film, for example. In a part of the insulating film 206 above the upper semiconductor layer 205, plural openings which reach the top surface of the upper semiconductor layer 205 are formed; and the first metal electrode 207 and the second metal electrode 208 are formed in the plural openings. The first metal electrode 207 and the second metal electrode 208 are electrodes for drawing current from the light receiving element 200. As shown in FIG. 3, the first metal electrode 207 and the second metal electrode 208 are electrodes having comb-shaped structures, and their comb teeth are arranged in an interdigitated manner.

The light receiving element 200 further comprises a waveguide 210 which comprises a lower cladding layer constructed by use of the BOX layer 202, a core layer 209 constructed by use of the SOI layer 203 on the BOX layer 202, and an upper cladding layer constructed by use of the insulating film 206. The core layer 209 of the waveguide 210 is in contact with a bottom surface of the light absorbing layer 204.

In the light receiving element 200, when light propagated through the core layer 209 of the waveguide 210 in the Y direction shown in FIG. 2 arrives at a position below the light absorbing layer 204, the light propagates through the construction comprising the core layer 209 and the light absorbing layer 204 in the Y direction, while the field of the light is gradually moved from the core layer 209 to the light absorbing layer 204; and the light is optically absorbed by the light absorbing layer 204. In the light absorbing layer 204, carriers (electrons and holes) are generated according to the absorbed light; the generated carriers move toward the first metal electrode 207 or the second metal electrode 208 according to their respective polarities; and, as a result, photoelectric current flows. The photoelectric current is drawn to the outside from the first metal electrode 207 and the second metal electrode 208.

The light receiving element 200 according to the present embodiment adopts, as a cap layer for covering the light absorbing layer 204, an Si layer (the upper semiconductor layer 205) which has thickness ($t_{top}$ and $t_{facet}$) such as those described above, so that a high Schottky barrier can be formed at the upper semiconductor layer 205 by joining the Si layer (the upper semiconductor layer 205) and the first and second metal electrodes 207 and 208 with each other; and, as a result, dark current that appears when a high bias voltage is applied can be effectively reduced. Further, since the light absorbing layer 204 is covered by the upper semiconductor layer 205 which does not include Ge, contamination due to Ge in a production line can be prevented.

Third Embodiment

Figure 4:
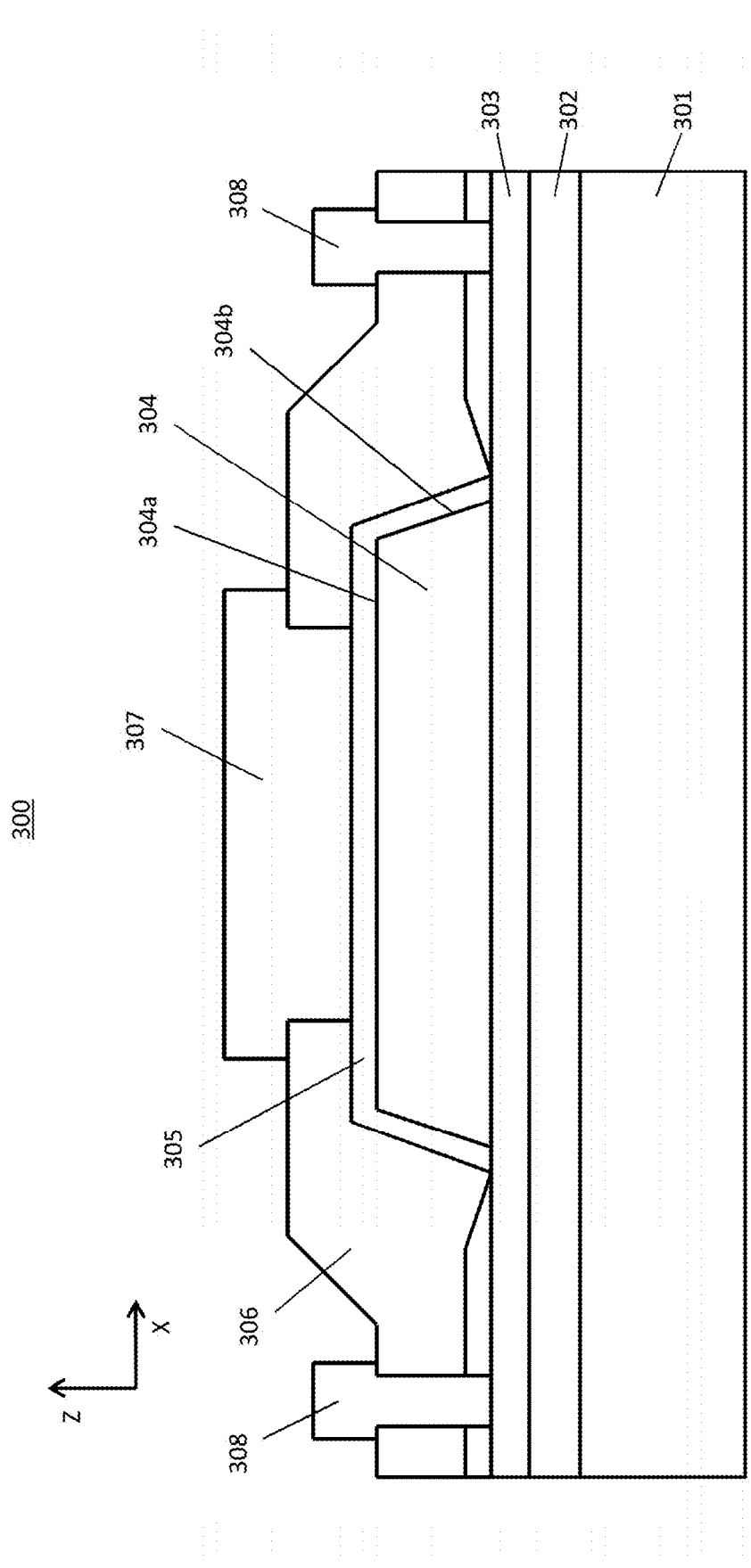
FIG. 4 is a drawing showing a schematic cross-sectional construction at an XZ section of a light receiving element (a pin-type photodiode) 300 according to a third embodiment.

FIG. 4 is a drawing which shows a schematic cross-sectional construction at an XZ section of a light receiving element (a pin-type photodiode) 300 according to a third embodiment of the present invention. The light receiving element 300 is a specific example of the optical device 100 according to the first embodiment. The light receiving element 300 comprises a lower semiconductor layer 303 formed on a buried oxide film layer (BOX layer) 302, a light absorbing layer 304 formed on the lower semiconductor layer 303, and an upper semiconductor layer 305 formed on the light absorbing layer 304. The lower semiconductor layer 303 is a p-type Si layer. The light absorbing layer 304 is an i-type Ge layer. The upper semiconductor layer 305 is an n-type Si layer. As explained above, the light receiving element 300 comprises a pin structure comprising the p-type Si layer 303, the i-type Ge layer 304, and the n-type Si layer 305. The light absorbing layer 304 and the upper semiconductor layer 305 correspond to the Ge layer 102 and the Si layer 103 of the optical device 100 shown in FIG. 1, respectively. The light receiving element 300 is made by using an SOI substrate which comprises an Si substrate 301, a BOX layer 302, and an SOI (Silicon On Insulator) layer 303 on the BOX layer 302.

The lower semiconductor layer 303 is a layer which comprises Si and is doped by introduction of a p-type impurity. As the p-type impurity, boron (B) may be used, for example. The lower semiconductor layer 303 is formed by doping the SOI layer 303 on the BOX layer 302 by introduction of a p-type impurity.

The light absorbing layer 304 is a layer which comprises Ge and is not doped by any impurity. The light absorbing layer 304 is formed by epitaxially growing a Ge crystalline layer on the lower semiconductor layer 303. A top surface 304a of the light absorbing layer 304 is a (001) plane of the Ge crystal lattice. Surfaces other than the (001) plane 304a of the light absorbing layer 304 are constructed as facet surfaces 304b. The facet surface 304b of the light absorbing layer 304 is a crystalline plane having an angle between a (110) plane and the (001) plane of the Ge crystal lattice. For example, the facet surface 304b of the light absorbing layer 304 is a (311) plane, and an angle between the facet surface 304b and the top surface 304a of the light absorbing layer 304 is, for example, between 20° and 40°. Note that the light absorbing layer 304 may be an SiGe layer which is a mixed crystal comprising Si and Ge.

The upper semiconductor layer 305 is a layer which comprises Si and is doped by introduction of an n-type impurity. As the n-type impurity, phosphorus (P) or arsenic (As) or the like may be used, for example. The upper semiconductor layer 305 is formed by epitaxially growing an Si crystalline layer in such a manner that it covers the (001) plane 304a and the facet surfaces 304b of the light absorbing layer 304, and further doping at least a part of the Si crystalline layer positioned on the (001) plane 304a of the light absorbing layer 304 by introduction of an n-type impurity. The film thickness of the upper semiconductor layer 305 is made in such a manner that the film thickness $t_{facet}$ of a part above the facet surface 304b of the light absorbing layer 304 (hereinafter, this is simply referred to as "the facet-part film thickness") is made to be thinner than the film thickness $t_{top}$ of a part above the (001) plane 304a of the light absorbing layer 304 (hereinafter, this is simply referred to as "the (001)-plane film thickness"). As explained previously, in the case that the film thickness of the Si layer (the upper semiconductor layer 305) at the facet part is thin, there may be a risk that dark current increases when a high bias voltage is applied. In the light receiving element 300 according to the present embodiment, the film thickness of the upper semiconductor layer 305 is controlled in such a manner that a ratio of the facet-part film thickness to the (001)-plane film thickness, i.e., $t_{facet}/t_{top}$, is set to 0.4 or greater, and the (001)-plane film thickness $t_{top}$ of the upper semiconductor layer 305 is set to a value equal to or greater than 9 nm and equal to or less than 30 nm.

The reason to set the (001)-plane film thickness $t_{top}$ of the upper semiconductor layer 305 to a value equal to or less than 30 nm is to prevent the electric resistance between the light absorbing layer 304 and a first metal electrode 307 from becoming excessively large. The basis to set the film thickness ratio of the upper semiconductor layer 305 to 0.4 or greater and the (001)-plane film thickness $t_{top}$ of the upper semiconductor layer 305 to 9 nm or greater will be explained later with reference to FIGS. 6 and 7. Note that the facet surface 304b of the light absorbing layer 304 may be a non-planar surface which has large roughness; and, due to such large roughness, the facet-part film thickness of the upper semiconductor layer 305 may vary locally. In such a case, the film thickness at a region, where the film thickness is thinnest, in the facet part is defined to be the facet-part film thickness $t_{facet}$ of the upper semiconductor layer 305.

The surface of the light receiving element 300 is covered by an insulating film 306. The insulating film 206 is an $SiO_2$ film, for example. In a part of the insulating film 306 above the upper semiconductor layer 305, an opening which reaches the top surface of the upper semiconductor layer 305 is formed; and the first metal electrode 307 is formed in the opening. Further, in parts of the insulating film 306 positioned at sides of the light absorbing layer 306, openings which reach the top surface of the lower semiconductor layer 303 are formed; and second metal electrodes 308 are formed in the openings. The first metal electrode 307 and the second metal electrodes 308 are electrodes for drawing current from the light receiving element 300.

The light receiving element 300 according to the present embodiment adopts, as a cap layer for covering the light absorbing layer 304, an Si layer (the upper semiconductor layer 305) which has thickness ($t_{top}$ and $t_{facet}$) such as those described above, so that a high Schottky barrier can be formed at the upper semiconductor layer 305 by joining the Si layer (the upper semiconductor layer 305) and the first metal electrode 307 with each other; and, as a result, dark current that appears when a high bias voltage is applied can be effectively reduced. Further, since the light absorbing layer 304 is covered by the upper semiconductor layer 305 which does not include Ge, contamination due to Ge in a production line can be prevented.

Figure 5:
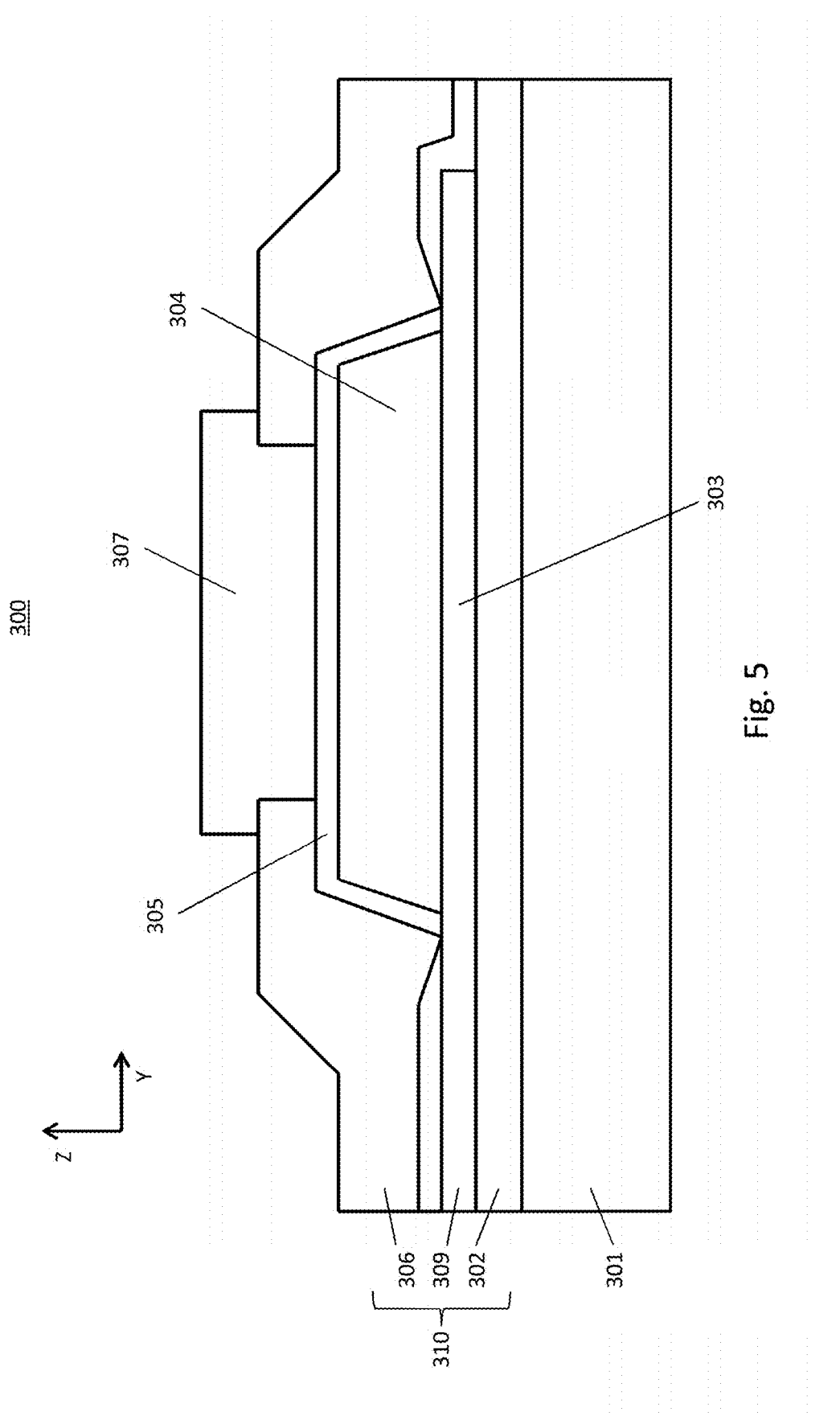
FIG. 5 is a drawing showing a schematic cross-sectional construction at a YZ section of the light receiving element (a pin-type photodiode) 300 according to the third embodiment.

FIG. 5 is a drawing which shows a schematic cross-sectional construction at a YZ section of the light receiving element (a pin-type photodiode) 300 according to the third embodiment. In FIG. 5, regarding the components which are the same as those shown in FIG. 4, reference symbols which are the same as those assigned to the components shown in FIG. 4 are assigned thereto, respectively. In the YZ section, the light receiving element 300 comprises a waveguide 310 which comprises a lower cladding layer constructed by use of the BOX layer 302, a core layer 309 constructed by use of the SOI layer on the BOX layer 302, and an upper cladding layer constructed by use of the insulating film 306. The BOX layer 302 used as a component for constructing the lower cladding layer and the insulating film 306 used as a component for constructing the upper cladding layer are the BOX layer 302 and the insulating film 306 shown in FIG. 4, respectively. The SOI layer used as a component for constructing the core layer 309 is the same as the SOI layer which is used as a component for constructing the lower semiconductor layer 303 shown in FIG. 4 and has not yet been doped with an impurity. The core layer 309 and the lower semiconductor layer 303 are formed by use of the shared SOI layer in a seamless manner. As explained above, the waveguide 310 is formed by use of the SOI substrate in which the pin structure of the light receiving element 300 shown in FIG. 4 is formed, at a position adjacent to the pin structure.

The light receiving element 300 is constructed in such a manner that light propagated through the core layer 309 of the waveguide 310 in the Y direction enters the lower semiconductor layer 303 via a side end part of the lower semiconductor layer 303. The light entered into the lower semiconductor layer 303 propagates through the pin structure in the Y direction, while the field of the light is gradually moved from the lower semiconductor layer 303 to the light absorbing layer 304; and the light is optically absorbed by the light absorbing layer 304. In the light absorbing layer 304, carriers (electrons and holes) are generated according to the absorbed light; the generated carriers move toward the lower semiconductor layer 303 and the upper semiconductor layer 305, respectively; and, as a result, photoelectric current flows. The photoelectric current is drawn to the outside from the first metal electrode 307 and the second metal electrode 308.

EXAMPLES

Figure 6:
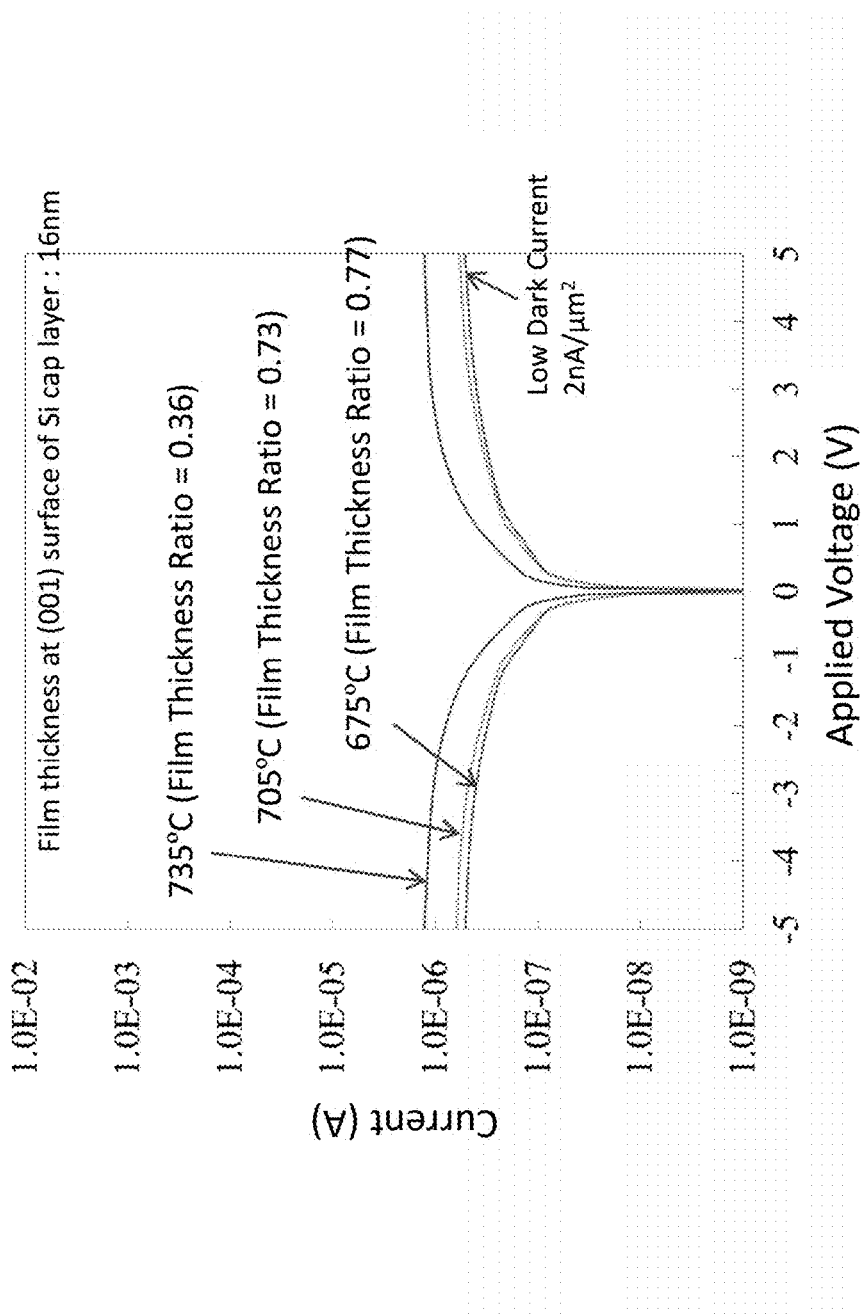
FIG. 6 is a drawing for explaining an appropriate range of film thickness $t_{top}$ and $t_{facet}$ of an Si cap layer.
Figure 7:
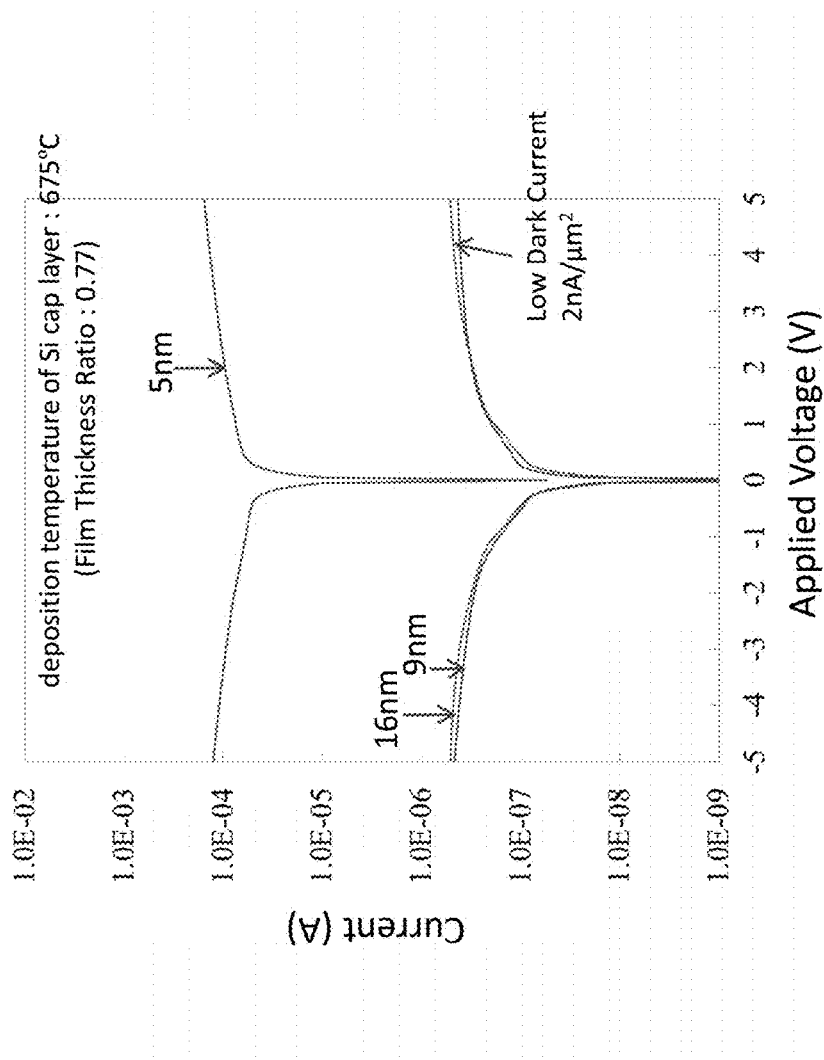
FIG. 7 is a drawing for explaining an appropriate range of film thickness $t_{top}$ and $t_{facet}$ of an Si cap layer.

Each of FIGS. 6 and 7 is a drawing to be used for explaining an appropriate range of film thickness $t_{top}$ and $t_{facet}$ of an Si cap layer (for example, the Si layer 103 of the optical device 100, the upper semiconductor layer 205 of the light receiving element 200, and the upper semiconductor layer 305 of the light receiving element 300) in the optical device (for example, the optical device 100 according to the first embodiment, the light receiving element 200 according to the second embodiment, and the light receiving element 300 according to the third embodiment) according to the present invention; and shows characteristics of dark current wherein matters other than the values of film thickness are measured by use of the MSM-type photodiode 200 which has a construction identical to that shown in FIG. 2.

First, deposition temperature when depositing the Si cap layer (the upper semiconductor layer) 205 was set to 675° C., 705° C., and 735° C., and three kinds of MSM-type photodiodes 200 (samples 1, 2, and 3, respectively) were made. The film thickness of the (001) plane of each Si cap layer 205 was set to 16 nm. Under the above condition, the film thickness ratios $t_{facet}/t_{top}$ of the Si cap layers 205 in the samples 1, 2, and 3 were 0.77, 0.73, and 0.36, respectively. As shown above, it is observed that there is a tendency that the film thickness ratio $t_{facet}/t_{top}$ of the Si cap layer 205 becomes smaller as the deposition temperature increases. As shown in FIG. 6, although low dark current (~2 nA/$\mu m^2$) was observed in each of the samples 1 and 2, dark current increased a little bit in the sample 3. Additionally, as a result of observation of a TEM image of a cross section of the sample 3, it is found that the interface between the light absorbing layer 204 and the Si cap layer 205 at the facet surface 204b had large unevenness. It is considered that the above condition had occurred due to intermixing at the interface between the light absorbing layer 204 and the Si cap layer 205 due to deposition of the Si cap layer 205 at high temperature (735° C.). In the interface which is positioned between the light absorbing layer 204 and the Si cap layer 205 and is in the above condition, an interface state is generated, and, as a result, a current leak path is formed and dark current increases thereby. Thus, in the case that the interface between the light absorbing layer 204 and the Si cap layer 205 is in such condition as explained above, dark current cannot be reduced even if the film thickness of the Si cap layer 205 is increased. In other words, based on the result obtained from the sample 3, it is determined that dark current cannot be reduced regardless of the film thickness of the Si cap layer 205, if the deposition temperature for the Si cap layer 205 is 735° C. or higher, i.e., if the film thickness ratio $t_{facet}/t_{top}$ of the Si cap layer 205 is 0.36 or less.

On the other hand, in a TEM image of a cross section of each of the samples 1 and 2, large unevenness was not observed in the interface between the light absorbing layer 204 and the Si cap layer 205 at the facet surface 204b. Thus, next, the deposition temperature for the Si cap layer 205 was set to 635° C., which is the same as that for the sample 1, and additional two kinds of MSM-type photodiodes 200 (samples 4 and 5), each of which having the film thickness ratio $t_{facet}/t_{top}$ of the Si cap layer 205 of 0.77, were made. The film thickness of the (001) plane of the Si cap layer 205 in the sample 4 was 9 nm, and that of the sample 5 was 5 nm. As shown in FIG. 7, although low dark current (~2 nA/µm²) was observed in the sample 4 like the case of the sample 1, dark current increased notably in the sample 5. Thus, based on the above result, it is found that dark current can be kept low, until the film thickness $t_{top}$ of the (001) plane of the Si cap layer 205 is thinned to 9 nm (in this case, the film thickness $t_{facet}$ of the facet part is 6.93 (=9*0.77) nm). In this manner, the film thickness of the facet part of the Si cap layer 205 cab be thinned at least up to 6.93 nm; and, when the above value is applied to the case of the above explained Si cap layer 205 (FIG. 6) wherein film thickness of the (001) plane is 16 nm, the film thickness ratio becomes $t_{facet}/t_{top}$=6.93/16≈0.4. This film thickness ratio can be realized by setting the deposition temperature to a temperature between 705° C. and 735° C., according to the relationship between the film thickness ratio and the deposition temperature of the Si cap layer 205. Accordingly, if the film thickness ratio $t_{facet}/t_{top}$ of the Si cap layer 205 is set to 0.4 or greater, formation of unevenness in the interface between the light absorbing layer 204 and the Si cap layer 205 at the facet surface 204b, i.e., formation of interface state, can be suppressed; so that dark current can be reduced.

Although embodiments of the present invention have been explained in the above description, the present invention is not limited to any of them; and the embodiments can be modified in various ways without departing from the scope of the gist of the present invention.

REFERENCE SIGNS LIST

100 Optical device
101 Substrate
102 Ge layer
103 Si layer
104 Metal electrode
105 Insulating film
200 Light receiving element
201 Si substrate
202 Buried oxide film layer (BOX layer)
203 SOI layer
204 Light absorbing layer
205 Upper semiconductor layer
206 Insulating film
207 First metal electrode
208 Second metal electrode
209 Core layer
210 Waveguide
300 Light receiving element (pin-type photodiode)
301 Si substrate
302 Buried oxide film layer (BOX layer)
303 Lower semiconductor layer
304 Light absorbing layer
305 Upper semiconductor layer
306 Insulating film
307 First metal electrode
308 Second metal electrode
309 Core layer
310 Waveguide

The invention claimed is:

1. An optical device comprising:
a semiconductor layer which comprises Ge and has a (001) plane and a facet surface between the (001) plane and a (110) plane; and
a cap layer which comprises Si and is formed on the (001) plane and the facet surface of the semiconductor layer;
wherein a ratio of a film thickness of the cap layer at the facet surface to a film thickness of the cap layer at the (001) plane is equal to or greater than 0.4 and equal to or less than 0.77.

2. The optical device according to claim 1, wherein the optical device is constructed as a light receiving element, a light emitting element, or an optical modulator.

3. The optical device according to claim 2, wherein the light receiving element is an MSM-type photodiode or a pin-type photodiode.

4. The optical device according to claim 1, wherein the film thickness of the cap layer at the (001) plane is equal to or greater than 9 nm and equal to or less than 30 nm.

* * * * *